(12) United States Patent
Tanida

(10) Patent No.: US 7,141,984 B2
(45) Date of Patent: Nov. 28, 2006

(54) SWITCHING CIRCUIT FOR CURRENT MEASUREMENT RANGE RESISTOR AND CURRENT MEASUREMENT APPARATUS INCLUDING SWITCHING CIRCUIT

(75) Inventor: Shinichi Tanida, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/157,892

(22) Filed: Jun. 21, 2005

(65) Prior Publication Data

US 2006/0012417 A1    Jan. 19, 2006

(30) Foreign Application Priority Data

Jun. 25, 2004   (JP)   ............... 2004-187312

(51) Int. Cl.
*G01R 31/08*   (2006.01)
(52) U.S. Cl. .................................... 324/522; 324/713
(58) Field of Classification Search ............... 324/522, 324/713; 327/403, 561
See application file for complete search history.

(56) References Cited

U.S. PATENT DOCUMENTS

| | | | | | |
|---|---|---|---|---|---|
| 5,059,889 | A | * | 10/1991 | Heaton | ........................ 323/285 |
| 5,325,068 | A | * | 6/1994 | Rauf | ........................... 324/713 |
| 5,469,071 | A | * | 11/1995 | Obata | .......................... 324/713 |
| 5,731,731 | A | * | 3/1998 | Wilcox et al. | .............. 327/403 |
| 5,847,592 | A | * | 12/1998 | Gleim et al. | ................ 327/403 |
| 5,994,947 | A | | 11/1999 | Sobolewski et al. | ........ 327/403 |
| 6,107,811 | A | * | 8/2000 | Caudill et al. | .............. 324/713 |

FOREIGN PATENT DOCUMENTS

| | | |
|---|---|---|
| JP | 05-119110 | 5/1993 |
| JP | 2004-187312 | 6/2004 |

* cited by examiner

*Primary Examiner*—Diane Lee
*Assistant Examiner*—Marina Kramskaya

(57) ABSTRACT

A switching circuit includes at least two first semiconductor switches, each having a first input portion and a second input portion; range resistors that are provided between output portions of the first semiconductor switches and a device under test and that have different resistances from each other; a second semiconductor switch having an input portion connected to the output portions of the first semiconductor switches; and a differential amplifier having an input portion connected to the output portion of the second semiconductor switch and an input portion connected to ends of the range resistors, the ends being adjacent to the device under test. In accordance with a control signal, a desired one of the first semiconductor switches is connected to the first input portion and the second switch is connected to the output portion of the desired first semiconductor switch.

14 Claims, 3 Drawing Sheets

SWITCHING CIRCUIT FOR CURRENT MEASUREMENT RANGE RESISTOR AND CURRENT MEASUREMENT APPARATUS INCLUDING SWITCHING CIRCUIT

BACKGROUND OF THE INVENTION

1. Field of the Invention

The present invention relates to a current measurement circuit used for evaluating/testing characteristics of, for example, an IC (integrated circuit) tester and also to an apparatus including the current measurement circuit.

2. Description of the Related Art

Examples of known circuits for switching current ranges using relay switches include a circuit disclosed in Japanese Unexamined Patent Application Publication No. 5-119110 (Document 1). The circuit switches a current range resistor 15 using a semiconductor switch, such as a CMOS 32 illustrated in FIG. 1 in this document. Such a semiconductor switch is low in cost compared to mechanical relays (or reed relays) illustrated in FIG. 1 in U.S. Pat. No. 5,994,947 (Document 2), which predates Document 1.

Although such a semiconductor switch is relatively inexpensive, it has a large amount of leakage current and shows somewhat inferior performance compared to mechanical switches.

To overcome such drawbacks, FIG. 2 of Document 2 illustrates a circuit that uses both relays and a semiconductor switch, such as an FET (field effect transistor). The circuit includes three relays (36, 42, and 46 in FIG. 2 in Patent Document 2), two diodes (38 and 40), one buffer (44), and two resistors (34 and 48).

However, the circuit configuration in FIG. 2 of Document 2 requires an increased number of components in order to overcome the drawbacks of degraded measurement accuracy due to leakage if the semiconductor switch is used. Thus, the cost required for the circuit configuration still remains high.

SUMMARY OF THE INVENTION

Accordingly, the present invention provides a low-cost current measurement circuit that is capable of performing high-performance measurement, that requires a small number of components, and that uses semiconductor switches.

One aspect of the present invention provides a switching circuit for range resistors for current measurement. The switching circuit includes: at least two first semiconductor switches, each having a first input portion, a second input portion, an output portion and being capable of switching a connection between the first input portion and the second input portion; range resistors provided between a device under test and the respective output portions of the at least two first semiconductor switches, the range resistors having different resistances from each other; and a second semiconductor switch having at least two input portions and an output portion, the input portions of the second semiconductor switch being connected to the output portions of the at least two first semiconductor switches. The switching circuit further includes: a differential amplifier having an input portion connected to the output portion of the second semiconductor switch and an input portion connected to first ends of the range resistors, the first ends being adjacent to the device under test; a voltage source that applies a reference voltage to the first input portions; and wires that connect the second input portions and the first ends of the range resistors. A desired one of the at least two first semiconductor switches which is connected to a desired one of the range resistors is connected to the first input portion and another one of the at least two first semiconductor switches is connected to the second input portion, and the second semiconductor switch is connected to the output portion of the desired first semiconductor switch.

Preferably, the switching circuit includes at least one of a noise elimination circuit and a buffer connected between the output portion of each first semiconductor switch and the second semiconductor switch. The switching circuit may include a buffer provided between the differential amplifier and the first ends of the range resistors, an output from the buffer being connected to the second input portions of the first semiconductor switches via the wire. The switching circuit may include a buffer provided between the differential amplifier and second ends of the range resistors, the second ends being adjacent to the first semiconductor switches.

Another aspect of the present invention provides a current measurement apparatus including the switching circuit described above.

The circuit in the present invention is configured so as to apply a reference voltage to the input portion of the range resistor that is not used for measurement. Thus, voltages across the range resistor that is not used for measurement can be made equal to each other. The present invention, therefore, provides a circuit in which almost no leakage current flows, even though the insulating resistance of the semiconductor switch used for range switching is not as high as that of a mechanic relay switch. Thus, when semiconductor switches are used to implement a current measurement circuit, the present invention can provide an advantage in that high-accuracy measurement can be achieved without the influence of leakage current. Further, since the circuit of the present invention can be configured with only semiconductor switches and without the use of mechanical relays, the present invention can facilitate the miniaturization of the circuit and an apparatus using the circuit.

DESCRIPTION OF THE PREFERRED EMBODIMENTS

Figure 1:
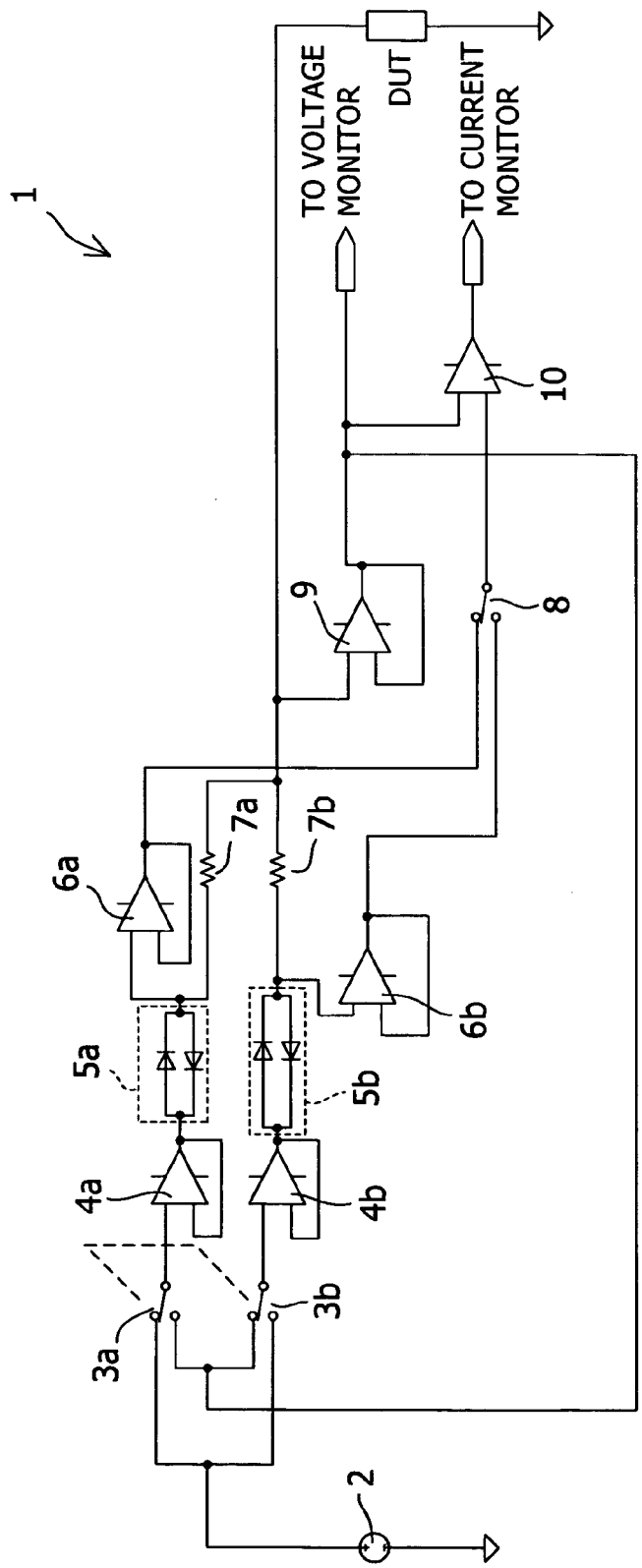
FIG. 1 is a circuit block diagram of a switching circuit including two first semiconductor switches and one second semiconductor switch according to a first embodiment of the present invention.

Specific embodiments of the present invention will be described below with reference to FIGS. 1 to 3. It is to be understood, however, that the embodiments herein are merely illustrative and the present invention is not limited thereto.

A circuit according to a first embodiment of the present invention will now be described with reference to FIG. 1. In FIG. 1, a switching circuit 1 for range resistors for current measurement includes a voltage source 2 that applies a reference voltage and two first semiconductor switches 3a and 3b that are connected so as to input the reference voltage, applied from the voltage source 2, to respective first input portions. The two first semiconductor switches 3a and 3b have respective output portions, which are connected to two inputs of a second semiconductor switch 8 via buffers 4a and 4b, noise elimination circuits 5a and 5b, and buffers 6a and 6b, respectively. In addition, outputs of the noise elimination circuits 5a and 5b are connected to respective first terminals of the range resistors 7a and 7b for current measurement, which resistors have different resistances. Second terminals of the current-measurement range resistors 7a and 7b, the second terminals not being connected to the noise elimination circuits 5a and 5b, are interconnected to output a voltage to a device under test (hereinafter referred to as a "DUT"). The output voltage for the DUT is also output to a voltage monitor via a buffer 9. The second semiconductor switch 8 selects and outputs one of the inputs from the buffers 6a and 6b. The output from the second semiconductor switch 8 and an output from the buffer 9 are input to a differential amplifier 10, which then outputs an output to a current monitor.

The first semiconductor switches 3a and 3b in this case each have a first input portion and a second input portion. The first input portions of the first semiconductor switches 3a and 3b are interconnected and are connected to the reference voltage. Similarly, the second input portions of the first semiconductor switches 3a and 3b are also interconnected and are connected to the output of the buffer 9 having the same potential as the output voltage for the DUT.

The first semiconductor switches 3a and 3b, which are connected to the current-measurement range resistors 7a and 7b, can perform a switching operation between the first input portions and the second input portions so that the reference voltage is applied to the first input portions of the first semiconductor switches 3a and 3b and the output voltage for the DUT is applied to the second input portions of the first semiconductor switches 3a and 3b. The second semiconductor switch 8 can also perform a switching operation so as to select one of the outputs from the first semiconductor switches 3a and 3b, which are connected to the current-measurement range resistors 7a and 7b.

The switching operations of the first semiconductor switches 3a and 3b and the second semiconductor switch 8 can be accomplished in accordance with, for example, an instruction or control signal output from a controller (not shown), including a computer or the like.

In use, the circuit 1 (or a measurement apparatus including the circuit 1) shown in FIG. 1 applies a voltage to the DUT and measures a voltage and current at the DUT. During the measurement, an output voltage for the DUT is input to the buffer 9, which then applies the output voltage to the voltage monitor, and the resulting voltage is measured via an analog-to-digital converter (not shown), thereby measuring a voltage at the DUT. Current flowing to the DUT is measured by determining a difference between voltages across the range resistor 7a or 7b, which is a current sensing resistor, through the use of the current monitor, which is an output from the differential amplifier 10.

A current measured by the above-described circuit may be significantly small, ranging from several picoamperes to several femtoamperes. More specifically, for example, with the full scale of 1 V, when a resistor of 1 TΩ is used for the current-measurement range resistor 7a, a current on the order of 1 pA can be measured, and when a resistor of 100 GΩ is used for the current-measurement range resistor 7b, a current on the order of 10 pA can be measured.

Next, the operation of the circuit will be described below with reference to FIG. 1. First, the first semiconductor switches 3a and 3b and the second semiconductor switch 8 perform switching operations so as to select one of the range resistors 7a and 7b, which are current sensing resistors, so that current from the DUT is supplied to the selected range resistors or to select one of the range resistors 7a and 7b so that a voltage at the selected range resistor is measured. Herein, the first semiconductor switches 3a and 3b and the second semiconductor switch 8 are each illustrated as a two-input switch. However, as in the following description for a circuit according to a second embodiment shown in FIG. 3, the second semiconductor switch 8 is not particularly limited to two-input switches.

Next, the switching operations of the first semiconductor switches 3a and 3b and the second semiconductor switch 8 shown in FIG. 1 will be described. First, a description is given of a case in which an instruction or control signal from the controller (not shown) is supplied to the first semiconductor switches 3a and 3b so that the current-measurement range resistor 7a is selected as a desired current-measurement range resistor (i.e., a case in which the switching is performed so that the reference voltage is applied to the first semiconductor switch 3a). In this case, the voltage at the left side of the range resistor 7a is a reference voltage from the voltage source 2 and the voltage at the right side of the range resistor 7a serves as an output voltage for the DUT. On the other hand, the voltages at two opposite ends of the range resistor 7a are both voltages output from the DUT, so that no current flows through the range resistor 7b. In this case, therefore, all output current flows through the range resistor 7a.

Further, in response to the switching operation of the first semiconductor switches 3a and 3b, the second semiconductor switch 8 executes a switching operation in accordance with the instruction or control signal from the controller (not shown) so as to supply an output from the range resistor 7a to the differential amplifier 10. The differential amplifier 10 then determines a difference between voltages across the range resistor 7a, so that a current flowing to the DUT can be measured.

Next, a case in which the instruction or control signal from the controller (not shown) is supplied to the first semiconductor switches 3a and 3b so that the range resistor 7b, which is different from the one in the case of FIG. 1, is selected as a current measurement resistor will be described with reference to FIG. 2. In this case, the voltage at the left side of the range resistor 7b is the reference voltage and the voltage at the right side serves as the output voltage for the DUT. On the other hand, the voltages at two opposite ends of the range resistor 7a are both output voltages for the DUT, so that almost no current flows through the range resistor 7a. Thus, in the case of FIG. 2, all output current flows through the range resistor 7b.

Further, in response to the switching operation of the first semiconductor switches 3a and 3b, the second semiconductor switch 8 executes a switching operation in accordance with the instruction or control signal from the controller so as to supply an output from the range resistor 7b to the differential amplifier 10. The differential amplifier 10 then determines a difference between voltages across the range resistor 7b, which is different from the one in FIG. 1, so that a current flowing to the DUT can be measured.

When the voltage of the voltage source 2 for applying the reference voltage is controlled so that the voltage at the DUT reaches a desired value, the voltage source 2 can serve as a voltage source having a current-monitor function. When the current at the DUT is controlled so as to reach a desired value, the voltage source 2 can also serve as a current source having a voltage-monitor function.

Figure 2:
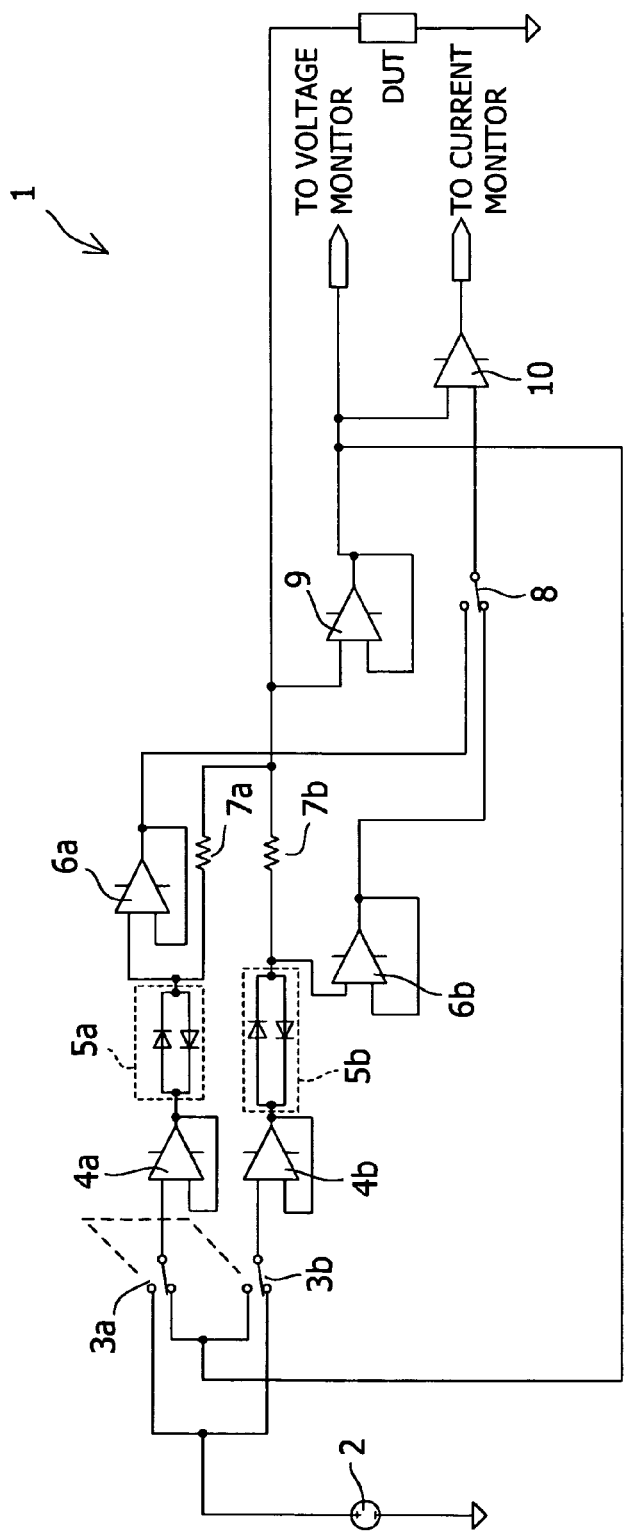
FIG. 2 is a circuit block diagram of a switching circuit in which the first semiconductor switches and the second semiconductor switch shown in FIG. 1 are switched to the opposite positions.

Although the noise elimination circuits 5a and 5b illustrated in FIGS. 1 and 2 include diodes that are connected in parallel with each other in the opposite direction, the noise elimination circuits 5a and 5b may also be omitted to constitute the circuit. In such a case, a switching circuit for current-measurement range resistors can be achieved at lower cost using semiconductor switches.

Figure 3:
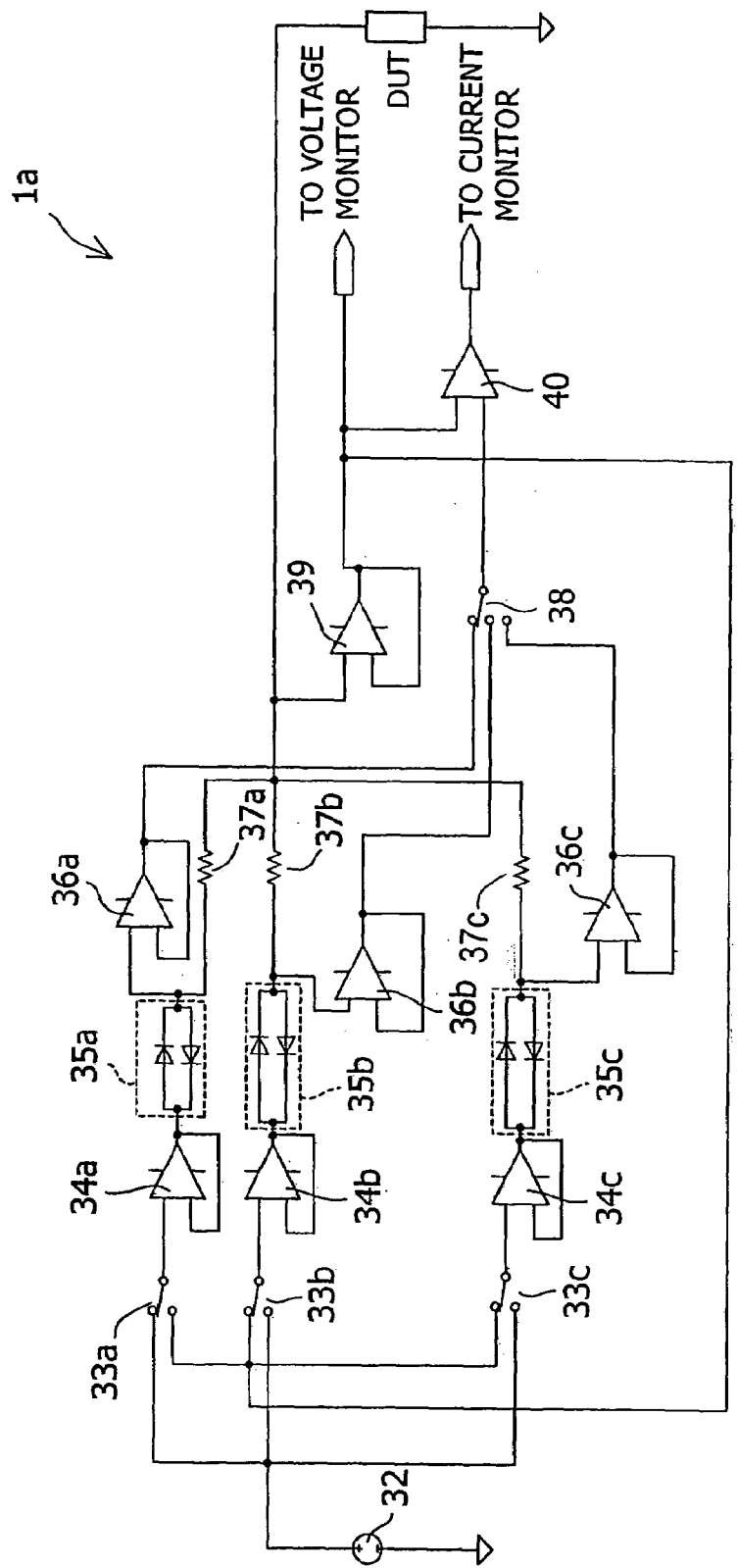
FIG. 3 is a circuit block diagram of a switching circuit including three first semiconductor switches and one second semiconductor switch according to a second embodiment of the present invention.

FIG. 3 is a circuit diagram showing a switching circuit 1a for three or more current measurement range resistors according to a second embodiment of the present invention. The circuit 1a of the second embodiment shown in FIG. 3 has some different points from the circuit 1 of the first embodiment shown in FIGS. 1 and 2. Specifically, another first semiconductor switch 33c is added to the circuit 1a, so that a second semiconductor switch 38 is a three-input switch. Further, a first semiconductor switch 33a has a connection opposite to that of two other first semiconductor switches 33b and 33c. With regard to other points, the circuit 1a performs a similar operation to the circuit 1 shown in FIGS. 1 and 2.

More specifically, referring to FIG. 3, the first semiconductor switch 33a, which is connected to a range resistor 37a used for current measurement, selects a first input portion for applying a reference voltage supplied from a voltage source 32. The second semiconductor switch 38 performs a switching operation so as to select an output for the range resistor 37a. The first semiconductor switches 33b and 33c, connected to range resistors 37b and 37c that are not used for current measurement, are switched so as to select a second input portion connected to an output of the buffer 39, so that an output voltage for the DUT is also applied to the range resistors 37b and 37c.

Similarly, when the range resistor 37b is in use, the first semiconductor switch 33b is switched to the first input portion, so that a reference voltage from the voltage source 32 is output to the range resistor 37b and the first semiconductor switch 33a and 33c operate so as to apply an output voltage for the DUT from the second input portions to the range resistors 37a and 37c.

Also, when the range resistor 37c is in use, the first semiconductor switch 33c is switched to the first input portion, so that the reference voltage from the voltage source 32 is output to the range resistor 37c and the first semiconductor switches 33a and 33b operate so as to apply an output voltage for the DUT from the second input portions to the range resistors 37a and 37b.

As in the first embodiment, the switching operation between the first semiconductor switches 33a, 33b, and 33c and the second semiconductor switch 38 can be carried out in response to a control signal or the like output from a controller (not shown).

While the switching circuit for current-measurement range resistors, using the semiconductor switches, has been described above, the switching circuit according to the present invention is not limited to a switching circuit for measuring micro current. For example, the present invention is also applicable to a current-range switching circuit for measuring a wide range of currents and to an apparatus including the switching circuit.

What is claimed is:

1. A switching circuit for range resistors for current measurement, the switching circuit comprising:
    at least two first semiconductor switches, each having a first input portion, a second input portion, and an output portion and being capable of switching a connection between the first input portion and the second input portion;
    range resistors provided between a device under test and the respective output portions of the at least two first semiconductor switches, the range resistors having different resistances from each other;
    a second semiconductor switch having at least two input portions and an output portion, the input portions of the second semiconductor switch being connected to the output portions of the at least two first semiconductor switches;
    a differential amplifier having an input portion connected to the output portion of the second semiconductor switch and an input portion connected to first ends of the range resistors, the first ends being adjacent to the device under test;
    a voltage source that applies a reference voltage to the first input portions; and
    wires that connect the second input portions and the first ends of the range resistors,
    wherein a desired one of the at least two first semiconductor switches which is connected to a desired one of the range resistors is connected to the first input portion and another one of the at least two first semiconductor switches is connected to the second input portion, and the second semiconductor switch is connected to the output portion of the desired first semiconductor switch.

2. The switching circuit according to claim 1, further comprising at least one of a noise elimination circuit and a buffer connected between the output portion of each first semiconductor switch and the second semiconductor switch.

3. The switching circuit according to claim 1, further comprising a buffer provided between the differential amplifier and the first ends of the range resistors, an output from the buffer being connected to the second input portions of the first semiconductor switches via the wire.

4. The switching circuit according to claim 1, further comprising a buffer provided between the differential amplifier and second ends of the range resistors, the second ends being adjacent to the first semiconductor switches.

5. The switching circuit according to claim 2, further comprising a buffer provided between the differential amplifier and the first ends of the range resistors, an output from the buffer being connected to the second input portions of the first semiconductor switches via the wire.

6. The switching circuit according to claim 2, further comprising a buffer provided between the differential amplifier and second ends of the range resistors, the second ends being adjacent to the first semiconductor switches.

7. The switching circuit according to claim 3, further comprising a buffer provided between the differential amplifier and second ends of the range resistors, the second ends being adjacent to the first semiconductor switches.

8. A current measurement apparatus including the switching circuit according to claim 1.

9. A current measurement apparatus including the switching circuit according to claim 2.

10. A current measurement apparatus including the switching circuit according to claim 3.

11. A current measurement apparatus including the switching circuit according to claim 4.

12. A current measurement apparatus including the switching circuit according to claim 5.

13. A current measurement apparatus including the switching circuit according to claim 6.

14. A current measurement apparatus including the switching circuit according to claim 7.

* * * * *